(12) United States Patent
Jang

(10) Patent No.: US 10,020,808 B2
(45) Date of Patent: Jul. 10, 2018

(54) IMPEDANCE CALIBRATION CIRCUIT AND SEMICONDUCTOR MEMORY APPARATUS HAVING THE SAME

(71) Applicant: SK hynix Inc., Icheon-si, Gyeonggi-do (KR)

(72) Inventor: Dong Wook Jang, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 73 days.

(21) Appl. No.: 15/200,064

(22) Filed: Jul. 1, 2016

(65) Prior Publication Data

US 2017/0302276 A1    Oct. 19, 2017

(30) Foreign Application Priority Data

Apr. 14, 2016 (KR) .................. 10-2016-0045599

(51) Int. Cl.
*H03K 19/00* (2006.01)
*G11C 7/12* (2006.01)
*G11C 7/10* (2006.01)
*G11C 7/22* (2006.01)

(52) U.S. Cl.
CPC .......... *H03K 19/0005* (2013.01); *G11C 7/10* (2013.01); *G11C 7/12* (2013.01); *G11C 7/22* (2013.01)

(58) Field of Classification Search
None
See application file for complete search history.

(56) References Cited

U.S. PATENT DOCUMENTS 9,478,267 B1 * 10/2016 Jeong .................. G11C 29/028
2008/0094112 A1 * 4/2008 Tanaka ................. H03K 17/164
                                                           327/108

FOREIGN PATENT DOCUMENTS

KR    1020090074427 A    7/2009
KR    1020140001000 A    1/2014

* cited by examiner

*Primary Examiner* — Jany Richardson
(74) *Attorney, Agent, or Firm* — William Park & Associates Ltd.

(57) ABSTRACT

An impedance calibration circuit includes a first reference resistor electrically coupled to a calibration pad, a second reference resistor which is coupled to the first reference resistor in parallel and a resistance value of the second reference resistor is varied according to an operation voltage mode, and a calibration circuit electrically coupled to the calibration pad and configured to generate a calibration code according to a resistance value formed by the first reference resistor and the second reference resistor and calibrate an impedance value in the calibration pad according to the calibration code.

19 Claims, 7 Drawing Sheets

IMPEDANCE CALIBRATION CIRCUIT AND SEMICONDUCTOR MEMORY APPARATUS HAVING THE SAME

CROSS-REFERENCES TO RELATED APPLICATION

This application claims priority under 35 U.S.C. 119(a) to Korean application No. 10-2016-0045599, filed on Apr. 14, 2016, in the Korean intellectual property Office, which is incorporated by reference in its entirety as set forth in full.

BACKGROUND

1. Technical Field

Various embodiments of the inventive concept relate to a semiconductor integrated apparatus, and more particularly, to an impedance calibration circuit and a semiconductor memory apparatus having the same.

2. Related Art

Semiconductor memory apparatuses may include a receiving circuit configured to receive a signal transmitted from an external apparatus and a transmitting circuit configured to transmit an internal signal to the external apparatus.

Swing widths of signals received and transmitted in and from the receiving circuit and the transmitting circuit of the semiconductor memory apparatus are relevant to speed of the semiconductor memory apparatus. That is, as the speed of the semiconductor memory apparatus is accelerated, a delay time required for signal transfer has to be minimized through reduction in the swing width of the signal.

As the swing width of the signal is reduced, the effect on external noise may be increased, and impedance mismatching of an interface of the semiconductor memory apparatus may occur.

The impedance mismatching may be caused by the external noise, change in a power voltage, variation of an operation temperature, and change in a fabrication process.

Accordingly, the impedance matching has to be performed to guarantee a high speed transfer of data and output reliable data.

In recent years, the semiconductor memory apparatuses may be configured to be operated according to a plurality of operation voltages and the impedance matching may be necessarily performed according to the levels of the operation voltages.

SUMMARY

According to an embodiment, there is provided an impedance calibration circuit. The impedance calibration circuit may include a first reference resistor electrically coupled to a calibration pad, a second reference resistor which is coupled to the first reference resistor in parallel and a resistance value of the second reference resistor is varied according to an operation voltage mode. The impedance calibration circuit may also include a calibration circuit electrically coupled to the calibration pad and configured to generate a calibration code according to a resistance value formed by the first reference resistor and the second reference resistor and calibrate an impedance value in the calibration pad according to the calibration code.

According to another embodiment, there is provided a semiconductor memory apparatus. The semiconductor memory apparatus may include an impedance calibration circuit configured to generate a calibration code according to a resistance value formed by a first reference resistor and a second reference resistor of which a resistance value is varied according to an operation voltage mode and calibrate an impedance value in a calibration pad to which the first and second reference resistors are coupled in response to the calibration code. The semiconductor memory apparatus may also include a data input/output driver configured to calibrate an impedance value of an output signal in response to the calibration code.

These and other features, aspects, and embodiments are described below in the section entitled "DETAILED DESCRIPTION".

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Figure 1:
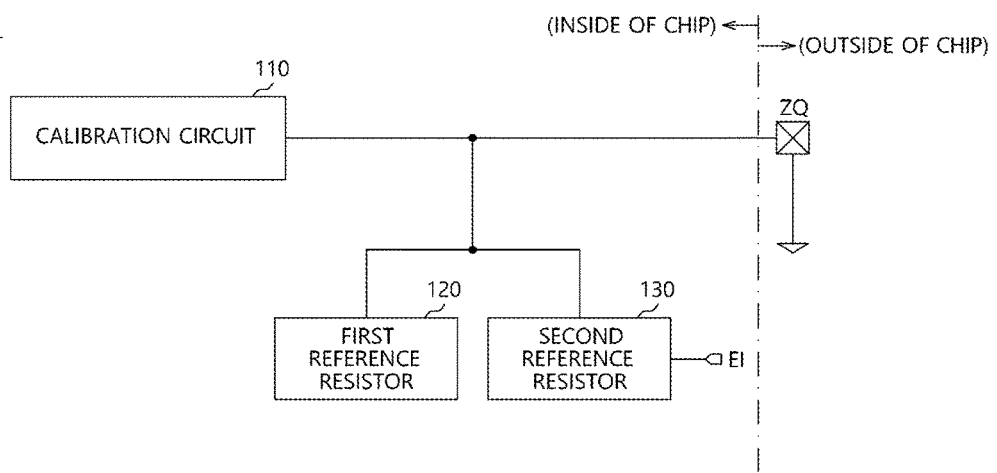
FIG. 1 is a configuration diagram illustrating an impedance calibration circuit according to an embodiment of the disclosure.

Exemplary embodiments will be described in greater detail with reference to the accompanying drawings. Exemplary embodiments are described herein with reference to cross-sectional illustrations that are schematic illustrations of the exemplary embodiments (and intermediate structures). As such, variations from the shapes of the illustrations as a result, for example, of manufacturing techniques and/or tolerances, are to be expected. Thus, embodiments should not be construed as limited to the particular shapes illustrated herein but may include deviations in shapes that result, for example, from manufacturing. In the drawings, lengths, and sizes of layers and regions may be exaggerated for clarity. Like reference numerals in the drawings denote like elements. It is also to be understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component. In addition, a singular form may include a plural form, and vice versa as long as it is not specifically mentioned.

The disclosure is described herein with reference to cross-section and/or plan illustrations of idealized embodiments of the disclosure. However, embodiments of the disclosure should not be construed as limiting the disclosure. Although a few embodiments of the disclosure will be shown and described, it will be appreciated by those of ordinary skill in the art that changes may be made in these exemplary embodiments without departing from the principles and spirit of the disclosure.

FIG. 1 is a configuration diagram illustrating an impedance calibration circuit according to an embodiment.

Referring to FIG. 1, an impedance calibration circuit 10 according to an embodiment may be configured to include a calibration circuit 110, a first reference resistor 120, and a second reference resistor 130.

The first reference resistor 120 may be configured to be electrically coupled to a calibration pad ZQ and the first reference resistor 120 may be embedded in a chip, for example, a semiconductor memory apparatus.

The second reference resistor 130 may be coupled to the first reference resistor 120 in parallel and a resistance value of the second reference resistor 130 may be determined in response to a control signal EI provided from a controller (not shown). The second reference resistor 130 may also be embedded in the chip and may also be configured to be electrically coupled to the calibration pad ZQ.

The calibration circuit 110 may be electrically coupled to the calibration pad ZQ and configured to generate a calibration code according to a resistance value formed by the first reference resistor 120 and the second reference resistor 130 and calibrate an impedance value in the calibration pad ZQ according to the generated calibration code.

In an embodiment, the first reference resistor 120 may be configured to serve as a resistance component in an impedance matching operation of the impedance calibration circuit 10. The resistance value of the second reference resistor 120 may be determined in response to the control signal EI generated according to the operation voltage mode of the semiconductor memory apparatus to which the impedance calibration circuit 10 is applied. In an embodiment, the second reference resistor 120 may be configured using a passive element.

It may be assumed that the semiconductor memory apparatus operates, for example, at 1.2 V and 1.8 V. In a first operation voltage mode in which the semiconductor memory apparatus operates at 1.2 V, only the first reference resistor 120 of the impedance calibration circuit 10 may serve as a resistance component and the calibration circuit 110 may calibrate the impedance value. In a second operation voltage mode in which the semiconductor memory apparatus operates at 1.8 V, both the first reference resistor 120 and the second reference resistor 130 of the impedance calibration circuit 10 may serve as a resistance component, and the calibration circuit 110 may calibrate the impedance value.

The resistance value of the second reference resistor 130 may vary according to the operation voltage mode, and the resistance value of the second reference resistor 130 may be determined by the control signal EI which is generated based on, for example, a mode register set (MRS) in a controller.

Figure 2:
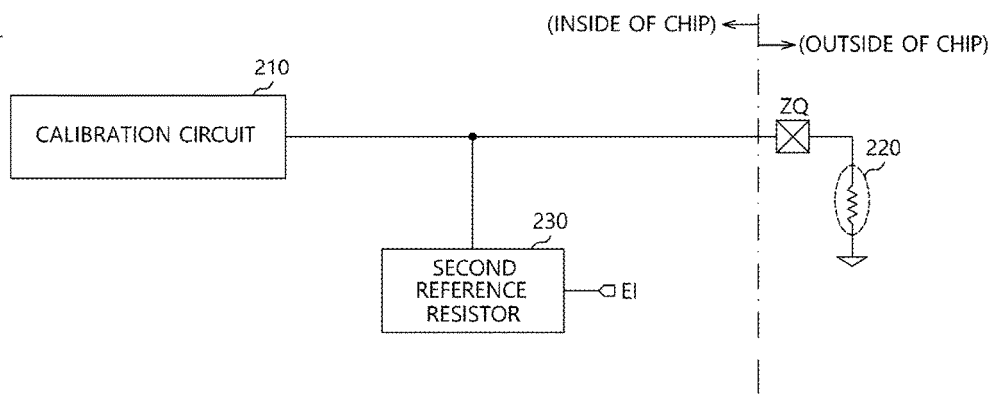
FIG. 2 is a configuration diagram illustrating an impedance calibration circuit according to an embodiment of the disclosure.

FIG. 2 is a configuration diagram illustrating an impedance calibration circuit according to an embodiment.

Referring to FIG. 2, an impedance calibration circuit 20 according to an embodiment may include a calibration circuit 210, a first reference resistor 220, and a second reference resistor 230.

The first reference resistor 220 may be configured to be electrically coupled to a calibration pad ZQ and the first reference resistor 220 may be disposed outside of a semiconductor chip, for example, a semiconductor memory apparatus.

The second reference resistor 230 may be coupled to the first reference resistor 220 in parallel and a resistance value of the second reference resistor 230 may be determined in response to a control signal EI provided from a controller (not shown). The second reference resistor 230 may be embedded in the semiconductor chip.

The calibration circuit 210 may be electrically coupled to the calibration pad ZQ. The calibration circuit 210 may be configured to generate a calibration code according to a resistance value formed by the first reference resistor 220 and the second reference resistor 230, and the calibration circuit 210 may be configured calibrate an impedance value in the calibration pad ZQ according to the generated calibration code.

An operation of the impedance calibration circuit 20 illustrated in FIG. 2 may be substantially the same as that of the impedance calibration circuit 10 illustrated in FIG. 1, but the impedance calibration circuit 20 of FIG. 1 is different from the impedance calibration circuit 10 of FIG. 1 in that the first reference resistor 220 of FIG. 2 is disposed outside of the chip.

Figure 3:
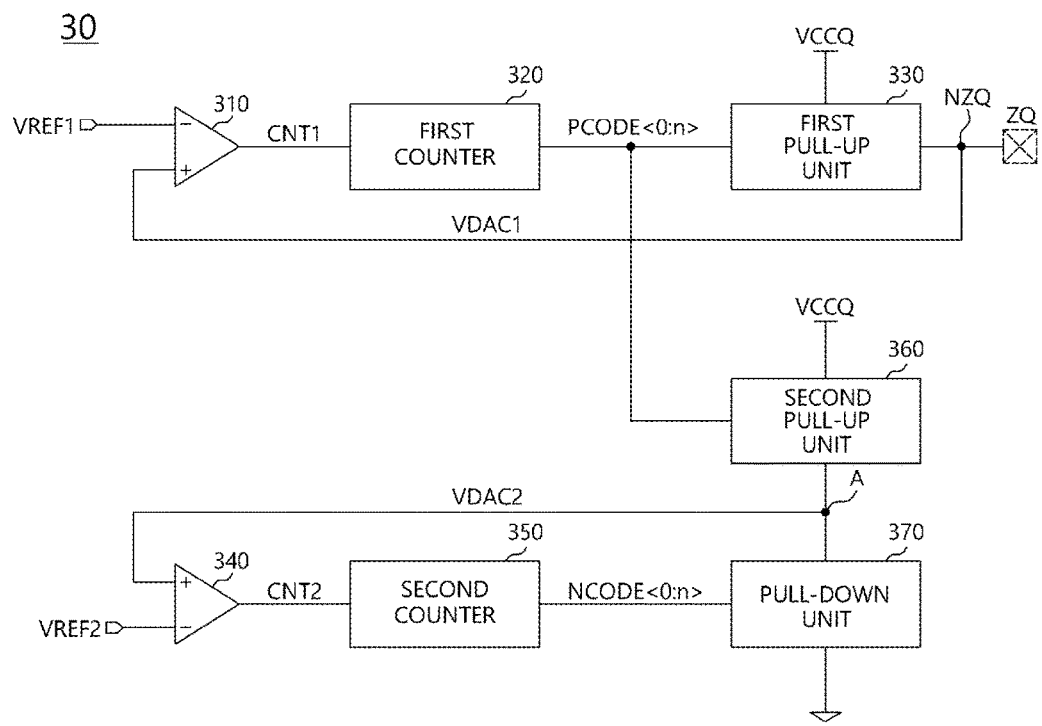
FIG. 3 is a configuration diagram illustrating a calibration circuit according to an embodiment of the disclosure.

FIG. 3 is a configuration diagram illustrating a calibration circuit according to an embodiment.

Referring to FIG. 3, a calibration circuit 30 according to an embodiment may be configured to include a first comparator 310, a first counter 320, a first pull-up unit or first pull-up circuit 330, a second comparator 340, a second counter 350, a second pull-up unit or second pull-up circuit 360, and a pull-down unit or pull-down circuit 370.

The first comparator 310 may be configured to generate a first comparison signal CNT1 by comparing a first reference voltage VREF1 and a first conversion voltage VDAC1.

The first counter 320 may be configured to vary a first code PCODE<0:n> in response to the first comparison signal CNT1.

The first pull-up unit 330 may be configured to generate the first conversion voltage VDAC1 in response to the first code PCODE<0:n>. In an embodiment, the first pull-up unit 330 may include a plurality of legs configured from one or more PMOS transistors. A first code PCODE<0:n> may be applied to gate terminals of the PMOS transistors constituting the legs one bit by one bit.

The first pull-up unit 330 may generate an analog first conversion voltage VDAC1 in response to the first code PCODE<0:n>, and thus the first pull-up unit 330 may refer to a first digital to analog converter (ADC).

The second comparator 340 may be configured to generate a second comparison signal CNT2 by comparing a second reference voltage VREF2 and a second conversion voltage VDAC2.

The second counter 350 may be configured to vary a second code NCODE<0:n> in response to the second comparison signal CNT2.

The second pull-up unit 360 may be configured to calibrate a resistance value in response to the first code PCODE<0:n>. In an embodiment, the second pull-up unit 360 may include a plurality of legs configured from a PMOS transistor.

The pull-down unit 370 may be configured to generate the second conversion voltage VDAC2 in response to the second code NCODE<0:n>. In an embodiment, the pull-down unit 370 may include a plurality of legs configured from an NMOS transistor.

Operation of the calibration circuit 30 illustrated in FIG. 3 will be described below.

The first comparator 310 may generate the first comparison signal CNT1 by comparing the first conversion voltage VDAC1 applied to a calibration node NZQ with the first reference voltage VREF1. The first conversion voltage VDAC1 may be determined according to a reference resistor RZQ coupled to the calibration pad ZQ for calibration and a resistor of the first pull-up unit 330. For example, the reference resistor RZQ may refer to the first reference resistor 120 in FIG. 1 or a parallel resistor of the first and second reference resistors 120 and 130 in FIG. 1. In another example, the reference resistor RZQ may refer to the first reference resistor 220 in FIG. 2 or a parallel resistor of the first and second reference resistors 220 and 230 in FIG. 2.

The first comparator 310 may generate the first comparison signal CNT1 by comparing the first conversion voltage VDAC1 generated in the first pull-up unit 330 and the first reference voltage VREF1.

The first counter 320 may generate the first code PCODE<0:n> in response to the first comparison signal CNT1.

The legs constituting the first pull-up unit 330 may be turned on/off according to the first code PCODE<0:n> to calibrate the impedance value of the first pull-up unit 330. The calibrated impedance value may affect the calibration node NZQ of the first pull-up unit 330 and thus change the level of the first conversion voltage VDAC1. The pull-up calibration operation may be repeated until the impedance value of the first pull-up unit 330 is equal to the impedance of the reference resistor RZQ.

The first code PCODE<0:n> may also be input to the second pull-up unit 360 to change an impedance value of the second pull-up unit 360.

Similar to the pull-up calibration operation, the pull-down calibration operation may be performed using the second comparator 340 and the second counter 350 so that a voltage of a node A is equal to the second reference voltage VREF2.

When the calibration operation is completed, the first code PCODE<0:n> may be generated so that the reference resistor RZQ has the same impedance value as the first pull-up unit 330, and the second code NCODE<0:n> may be generated so that the second pull-up unit 360 has the same impedance value as the pull-down unit 370.

The first code PCODE<0:n> and the second code NCODE<0:n> may refer to a calibration code and may be transmitted to a termination circuit which terminates an interface node for data I/O to calibrate an impedance value of the termination circuit.

The configuration of the calibration circuit 30 illustrated in FIG. 3 is merely an example, and any circuit configuration which may perform an impedance matching through a comparison between the voltage of the calibration node NZQ and the reference voltages VREF1 and VREF2 may be employed as the calibration circuit.

Figure 4:
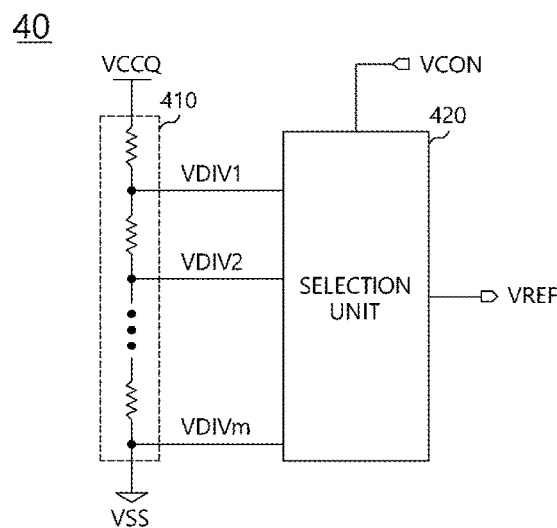
FIG. 4 is a configuration diagram illustrating a reference voltage generation circuit according to an embodiment of the disclosure.

FIG. 4 is a configuration diagram illustrating a reference voltage generation circuit according to an embodiment.

Referring to FIG. 4, a reference voltage generation circuit 40 according to an embodiment may be configured to include a voltage division unit or voltage division circuit 410 and a selection unit or selection circuit 420.

The voltage division unit 410 may be configured to generate first to m-th divided voltages VDIV1 to VDIVm by dividing a power voltage VCCQ provided from the outside.

The selection unit 420 may be configured to select any one of the first to m-th divided voltages VDIV1 to VDIVm and output the selected divided voltage as a reference voltage VREF in response to a voltage control signal VCON.

The first reference voltage VREF1 and the second reference voltage VREF2 in the calibration circuit 30 illustrated in FIG. 3 may be generated, for example, through the reference voltage generation circuit 40 illustrated in FIG. 4, but is not limited thereto.

It has been described that the first pull-up unit 330 and the second pull-up unit 360 constituting the calibration circuits 110, 210, and 30 include a plurality of legs.

Figure 5:
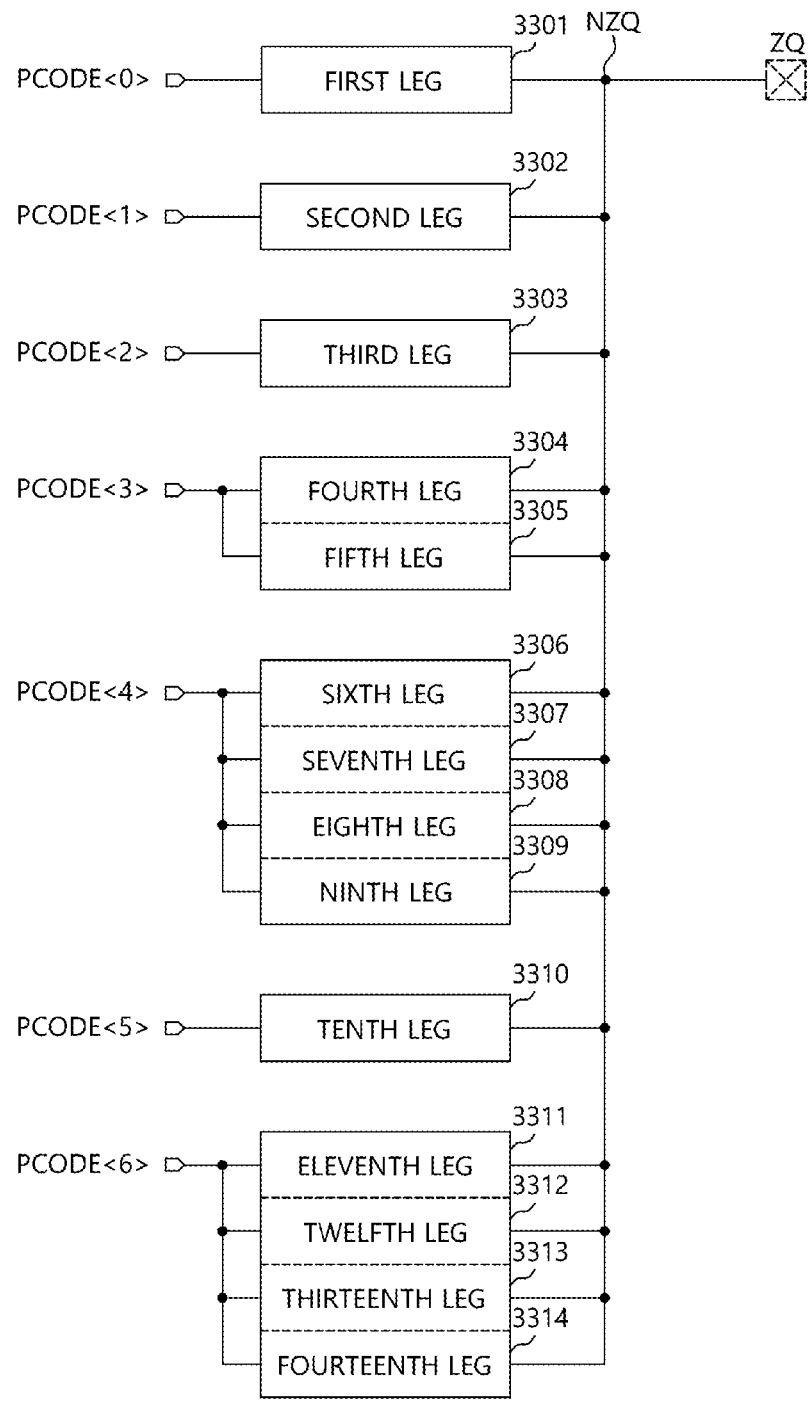
FIG. 5 is a configuration diagram illustrating a pull-up unit according to an embodiment of the disclosure.

FIG. 5 is a configuration diagram illustrating a pull-up unit according to an embodiment.

Referring to FIG. 5, a pull-up unit or pull-up circuit 330-1 may include first to fourteenth legs 3301 to 3314. Each leg 3301 to 3314 may be configured of, for example, a PMOS transistor.

The first to fourteenth legs 3301 to 3314 may be driven by the first code PCODE<0:6>.

In an embodiment, the first leg 3301, the second leg 3302, the fourth to ninth legs 3304 to 3309, and the eleventh to fourteenth legs 3311 to 3314 may have the same resistance value "a" (for example, 300Ω). The third leg 3303 may have a resistance value "2a" (for example, 600Ω). The tenth leg 3310 may have a resistance value "4a" (for example, 1200Ω).

The first to third legs 3301 to 3303 and the tenth leg 3310 may be controlled by corresponding code bits PCODE<0>, PCODE<1>, PCODE<2>, and PCODE<5> of the first code PCODE<0:6>. The fourth and fifth legs 3304 and 3305 may be commonly controlled by a corresponding code bit PCODE<3> of the first code PCODE<0:6>. The sixth to ninth legs 3306 to 3309 may be commonly controlled by a corresponding code bit PCODE<4> of the first code PCODE<0:6>. The eleventh to fourteenth legs 3311 to 3314 may be commonly controlled by a corresponding code bit PCODE<6> of the first code PCODE<0:6>.

Accordingly, an impedance of the pull-up unit 330-1 may be calibrated according to the levels of the code bits constituting the first code PCODE<0:6>, and a voltage applied to the calibration node NZQ may be determined according to the calibrated impedance.

In an embodiment, it is assumed that the semiconductor memory apparatus has two operation voltage modes of 1.2 V and 1.8 V. When a resistance value of a reference voltage RZQ1 in a first operation voltage mode (1.2 V) is 300Ω, a resistance value of a calibration resistor RON which is a resistor of the pull-up unit 330-1 may be calibrated to 1/6, 1/8.5, and 1/12 resistance values of the reference resistor RZQ1 and the like. A resistance value of a reference voltage RZQ2 in the second operation voltage mode (1.8 V) is 150Ω according to FIG. 1 or 2, and the resistance value of the calibration resistor RON which is the resistor of the pull-up unit 330-1 may be calibrated to 1/3, 1/4.25, and 1/6 resistance values of the reference resistor RZQ2 and the like.

TABLE 1

|  | VCCQ = 1.2 V | VCCQ = 1.8 V |
|---|---|---|
| RON | 50(≈RZQ1/6) | 50(≈RZQ1/3) |
|  | 35(≈RZQ1/8.5) | 35(≈RZQ2/4.25) |
|  | 25(≈RZQ1/12) | 25(≈RZQ1/6) |

For example, the first code PCODE<0:6> may be generated as the following Table 2.

TABLE 2

|  |  | PCODE<0> | PCODE<1> | PCODE<2> | PCODE<3> | PCODE<4> | PCODE<5> | PCODE<6> |
|---|---|---|---|---|---|---|---|---|
| VCCQ = 1.2 V | RON-50 | 0 | 0 | 0 | 1 | 1 | 0 | 0 |
|  | RON-35 | 1 | 1 | 1 | 1 | 1 | 0 | 0 |
|  | RON-25 | 1 | 1 | 1 | 1 | 1 | 0 | 1 |
| VCCQ = 1.8 V | RON-50 | 1 | 0 | 0 | 1 | 0 | 0 | 0 |
|  | RON-35 | 0 | 0 | 0 | 0 | 1 | 1 | 0 |
|  | RON-25 | 0 | 0 | 0 | 1 | 1 | 0 | 0 |

Accordingly, when the pull-up unit 330-1 is configured as illustrated in FIG. 5, various calibration resistors may be implemented according to the operation voltage.

Figure 6:
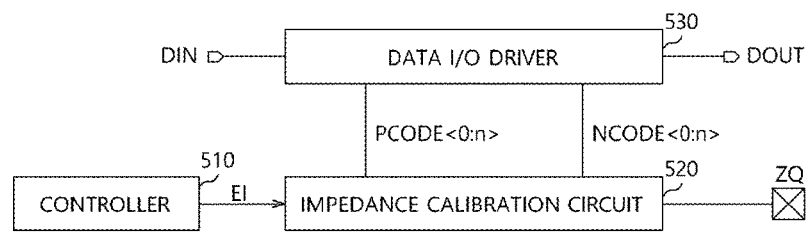
FIG. 6 is a configuration diagram illustrating a semiconductor memory apparatus according to an embodiment of the disclosure.

FIG. 6 is a configuration diagram illustrating a semiconductor memory apparatus according to an embodiment.

Referring to FIG. 6, a semiconductor memory apparatus 50 according to an embodiment may include a controller 510, an impedance calibration circuit 520, and a data input/output (I/O) driver 530.

The controller 510 may control the semiconductor memory apparatus 50 in response to a request of an external apparatus (for example, a host). The controller 510 may control the semiconductor memory apparatus 50 according to an internal request without the need of a request of the external apparatus.

The impedance calibration circuit 520 may be electrically coupled to a calibration pad ZQ and configured to generate calibration codes PCODE<0:n> and NCODE<0:n> according to a resistance value of a reference resistor RZQ through control of the controller 510, and the impedance calibration circuit 520 may calibrate an impedance value in the calibration pad ZQ according to the generated calibration codes PCODE<0:n> and NCODE<0:n>.

The impedance calibration circuit 520 may be configured as illustrated in FIG. 1 or 2. Accordingly, the impedance calibration circuit 520 may determine the resistance value of the reference resistor RZQ in response to a control signal EI provided from the controller 510 according to the operation voltage mode of the semiconductor memory apparatus 50.

The data I/O driver 530 may receive input data DIN from a memory cell array (not shown). The data I/O driver 530 may generate output data DOUT by driving the input data DIN according to the calibration codes PCODE<0:n> and NCODE<0:n> provided from the impedance calibration circuit 520. The calibration codes PCODE<0:n> and NCODE<0:n> may include a first code PCODE<0:n> and a second code NCODE<0:n>.

A termination resistance value RTT of the data I/O driver 530 may be determined according to the calibration codes PCODE<0:n> and NCODE<0:n> provided from the impedance calibration circuit 520. Accordingly, the impedance value corresponding to the output data DOUT and an impedance value of an external apparatus which performs interfacing on the output data DOUT may be calibrated to be substantially equal to each other.

Figure 7:
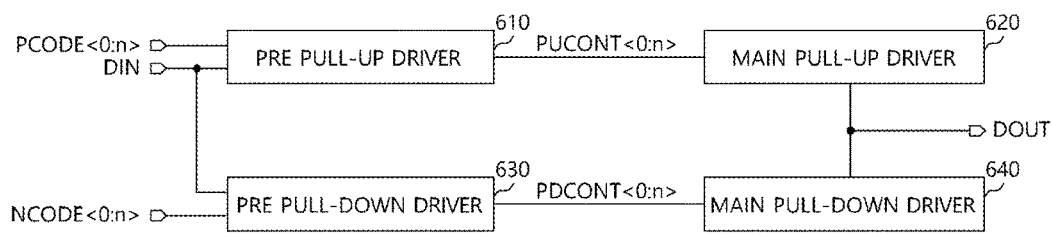
FIG. 7 is a configuration diagram illustrating a data input/output driver according to an embodiment of the disclosure.

FIG. 7 is a configuration diagram illustrating a data I/O driver according to an embodiment.

Referring to FIG. 7, a data I/O driver 60 according to an embodiment may include a pre pull-up diver 610, a main pull-up driver 620, a pre pull-down driver 630, and a main pull-down driver 640.

The pre pull-up driver 610 may be configured to generate a pull-up control signal PUCONT<0:n> in response to the first code PCODE<0:n> provided from the impedance calibration circuit 520 and the input data DIN.

The pre pull-down driver 630 may be configured to generate a pull-down control signal PDCONT<0:n> in response to the second code NCODE<0:n> provided from the impedance calibration circuit 520 and the input data DIN.

The main pull-up driver 620 and the main pull-down driver 640 may be configured to generate the output data DOUT of which the impedance value is calibrated in response to the pull-up control signal PUCONT<0:n> and the pull-down control signal PDCONT<0:n>.

That is, the main pull-up driver 620 may perform pull-up driving on the output data DOUT, and a driving force of the main pull-up driver 620 may be controlled by the pull-up control signal PUCONT<0:n>. The main pull-down driver 640 may perform pull-down driving on the output data DOUT and a driving force of the main pull-down driver 640 may be controlled by the pull-down control signal PDCONT<0:n>.

Figure 8:
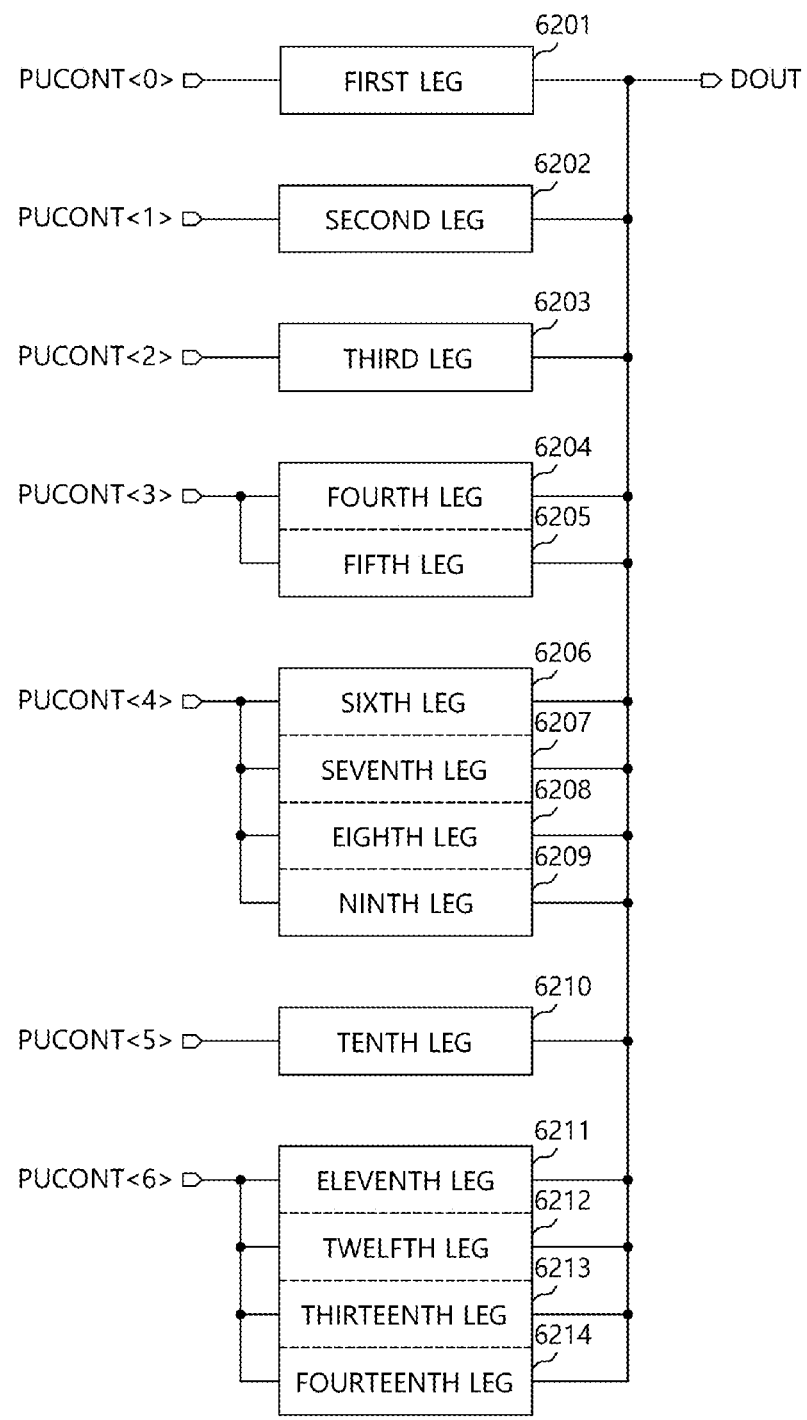
FIG. 8 is a configuration diagram illustrating a main pull-up driver according to an embodiment of the disclosure.

FIG. 8 is a configuration diagram illustrating a main pull-up driver according to an embodiment.

Referring to FIG. 8, a main pull-up driver 620-1 according to an embodiment may include first to fourteenth legs 6201 to 6214. Each leg 6201 to 6214 may be configured of, for example, a PMOS transistor.

The first to fourteenth legs 6201 to 6214 may be driven by a pull-up control signal PUCONT<0:6>.

In an embodiment, the first leg 6201, the second leg 6202, the fourth to ninth legs 6204 to 6209, and the eleventh to fourteenth legs 6211 to 6214 may have the same resistance value "a" (for example, 300Ω). The third leg 6203 may have a resistance value "2a" (for example, 600Ω). The tenth leg 6210 may have a resistance value "4a" (for example, 1200Ω).

The first to third legs 6201 to 6203 and the tenth leg 6210 may be controlled by corresponding signal bits PUCONT<0>, PUCONT<1>, PUCONT<2>, and PUCONT<5> of the pull-up control signal PUCONT<0:6>. The fourth and fifth legs 6204 and 6205 may be commonly controlled by a corresponding signal bit PUCONT<3> of the pull-up control signal PUCONT<0:6>. The sixth to ninth legs 6206 to 6209 may be commonly controlled by a corresponding signal bit PUCONT<4> of the pull-up control signal PUCONT<0:6>. The eleventh to fourteenth legs 6211 to 6214 may be commonly controlled by a corresponding signal bit PUCONT<6> of the pull-up control signal PUCONT<0:6>.

Accordingly, the impedance of the output data DOUT generated in the main pull-up driver 620-1 may be calibrated according to the levels of the signal bits constituting the pull-up control signal PUCONT<0:6>.

In an embodiment, it is assumed that the semiconductor memory apparatus has two operation voltage modes of 1.2 V and 1.8 V. When a resistance value of a reference voltage RZQ1 on which the impedance calibration circuit 520 performs calibration is 300Ω in a first operation voltage mode (1.2 V), a resistance value of a termination resistor RTT which is a resistor of the main pull-up driver 620-1 may be calibrated to 1/1, 1/1.5, 1/2, 1/3, and 1/5 resistance values of the reference resistor RZQ1 and the like. A resistance value of a reference voltage RZQ2 is 150Ω in a second operation voltage mode (1.8 V) according to FIG. 1 or 2, and the resistance value of the termination resistor RTT which is the resistor of the main pull-up driver 620-1 may be calibrated to 1/0.5, 1/0.75, 1/1, 1/1.5, and 1/2.5 resistance values of the reference resistor RZQ2 and the like.

TABLE 3

|  | VCCQ = 1.2 V | VCCQ = 1.8 V |
|---|---|---|
| RTT | 150(≈RZQ1/1) | 150(≈RZQ1/0.5) |
|  | 100(≈RZQ1/1.5) | 100(≈RZQ1/0.75) |
|  | 75(≈RZQ1/2) | 75(≈RZQ1/1) |
|  | 50(≈RZQ1/3) | 50(≈RZQ1/1.5) |
|  | 30(≈RZQ1/5) | 30(≈RZQ1/2.5) |

For example, the pull-up control signal PUCONT <0:6> may be generated as the following Table 4.

TABLE 4

|  |  | PUCONT<0> | PUCONT<1> | PUCONT<2> | PUCONT<3> | PUCONT<4> | PUCONT<5> | PUCONT<6> |
|---|---|---|---|---|---|---|---|---|
| VCCQ = 1.2 V | RTT = 150 | 0 | 0 | 0 | 1 | 0 | 0 | 0 |
|  | RTT = 100 | 1 | 0 | 0 | 1 | 0 | 0 | 0 |
|  | RTT = 75 | 0 | 0 | 0 | 0 | 1 | 0 | 0 |
|  | RTT = 50 | 0 | 0 | 0 | 1 | 1 | 0 | 0 |
|  | RTT = 30 | 1 | 1 | 1 | 1 | 1 | 0 | 0 |
| VCCQ = 1.8 V | RTT = 150 | 1 | 0 | 0 | 0 | 0 | 0 | 0 |
|  | RTT = 100 | 1 | 0 | 1 | 0 | 0 | 0 | 0 |
|  | RTT = 75 | 0 | 0 | 0 | 1 | 0 | 0 | 0 |
|  | RTT = 50 | 1 | 0 | 0 | 1 | 0 | 0 | 0 |
|  | RTT = 30 | 1 | 0 | 0 | 0 | 1 | 0 | 0 |

Accordingly, when the main pull-up driver 620-1 is configured as illustrated in FIG. 8, various termination resistors may be implemented according to the operation voltage.

Figure 9:
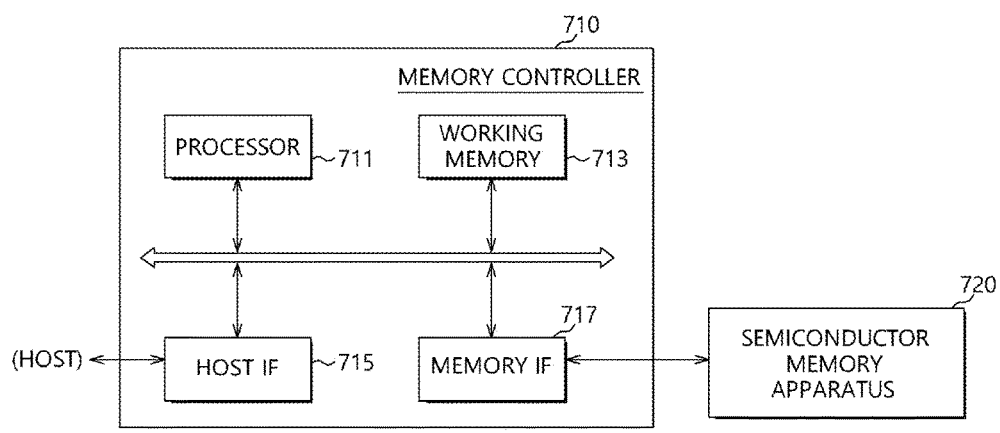
FIGS. 9 to 11 are configuration diagrams illustrating electronic apparatuses according to embodiments of the disclosure.
Figure 10:
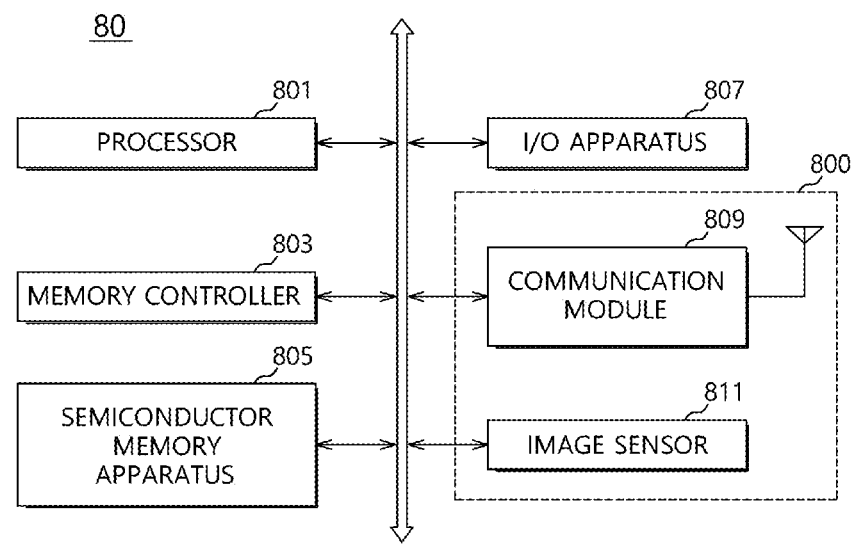
Figure 11:
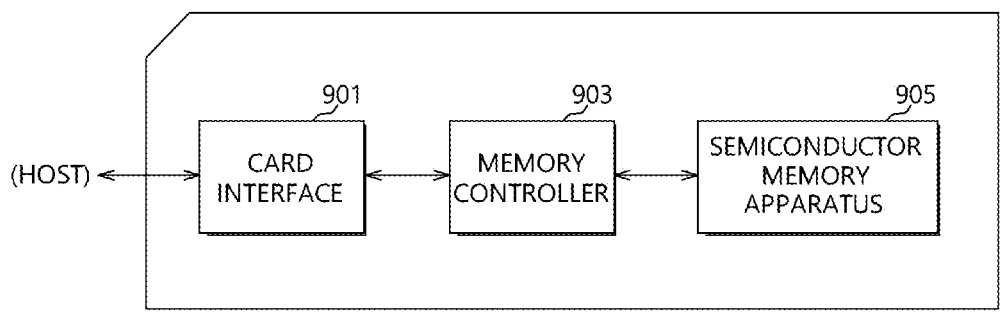

FIGS. 9 to 11 are configuration diagrams illustrating electronic apparatuses according to various embodiments.

An electronic apparatus 70 illustrated in FIG. 9 may include a memory controller 710 and a semiconductor memory apparatus 720.

The memory controller 710 may be configured to access the semiconductor memory apparatus 720 in response to a request from a host. The memory controller 710 may include a processor 711, a working memory 713, a host interface 715, and a memory interface 717.

The processor 711 may be configured to control an overall operation of the memory controller 710. The working memory 713 may store an application, data, a control signal, and the like required for operation of the memory controller 710.

The host interface 715 may perform protocol conversion for exchange of data and a control signal between the host and the memory controller 710, and the memory interface 717 may perform protocol conversion for exchange of data and a control signal between the memory controller 710 and the semiconductor memory apparatus 720.

The semiconductor memory apparatus 720 may include, for example, the impedance calibration circuit illustrated in FIG. 1 or 2. For example, the semiconductor memory apparatus 720 may be configured as illustrated in FIG. 6, but the semiconductor memory apparatus 720 is not limited thereto. That is, the semiconductor memory apparatus 720 may be configured to perform the impedance matching operation in a plurality of operation voltage modes.

The electronic apparatus 70 illustrated in FIG. 9 may be used as a disc apparatus or internal/external memory cards of a portable electronic apparatus. The electronic apparatus 70 may be used as an image processor and other application chipsets.

The working memory 713 included in the memory controller 710 may include, for example, the impedance calibration circuit illustrated in FIG. 1 or 2. For example, the working memory 713 may be configured as the semiconductor memory apparatus illustrated in FIG. 6.

An electronic apparatus 80 illustrated in FIG. 10 may include a processor 801, a memory controller 803, a semiconductor memory apparatus 805, an I/O apparatus 807, and a function module 800.

The memory controller 803 may control a data processing operation, for example, a program operation, a read operation, and the like of the semiconductor memory apparatus 805 according to control of the processor 801.

Data programmed in the semiconductor memory apparatus 805 may be output through the I/O apparatus 807 according to control of the processor 801 and the memory controller 803. For example, the I/O apparatus 807 may include a display apparatus, a speaker apparatus, and the like.

The I/O apparatus 807 may also include an input apparatus, and the I/O apparatus 807 may input a control signal for controlling an operation of the processor 801 or a data to be processed in the processor 801 through the input apparatus.

In another embodiment, the memory controller 803 may be implemented with a portion of the processor 801 or a separate chipset from the processor 801.

The semiconductor memory apparatus 805 may include the impedance calibration circuit illustrated in FIG. 1 or 2. For example, the semiconductor memory apparatus 805 may be configured as illustrated in FIG. 6. Accordingly, the semiconductor memory apparatus 805 may be configured to perform the impedance matching operation in a plurality of operation voltage modes.

The function module 800 may be a module which may perform a function selected according to an application example of the electronic apparatus 80 illustrated in FIG. 10, and a communication module 809 and an image sensor 811 as an example of the function module 800 are illustrated in FIG. 10.

The communication module 809 may be connected to a wired or wireless communication network to provide a communication environment which may exchange data and a control signal.

The image sensor 811 may convert an optical image to digital image signals and transfer the digital image signals to the processor 801 and the memory controller 803.

When the function module 800 includes the communication module 809, the electronic apparatus 80 of FIG. 10 may be a portable communication apparatus such as a wireless communication terminal. When the function module 800 includes the image sensor 811, the electronic apparatus 80 may be a digital camera, a digital camcorder, or an electronic apparatus (for example, a personal computer (PC), a laptop computer, a mobile communication terminal, and the like) to which any one of the digital camera and the digital camcorder is attached.

An electronic apparatus 90 illustrated in FIG. 11 may include a card interface 901, a memory controller 903, and a semiconductor memory apparatus 905.

FIG. 11 is an illustrative diagram illustrating the electronic apparatus 90 used as a memory card or a smart card, and the electronic apparatus 90 illustrated in FIG. 11 may be any one among a PC card, a multimedia card, an embedded multimedia card, a secure digital card, and a universal serial bus (USB) drive.

The card interface 901 may perform interacting on data exchanged between a host and the memory controller 903 according to a protocol of the host. In an embodiment, the card interface 901 may refer to hardware which may support a protocol used in the host, software installed in the hardware which may support the protocol used in the host, or a signal transmission method.

The memory controller 903 may control data exchanged between the semiconductor memory apparatus 905 and the card interface 901.

The semiconductor memory apparatus 905 may include, for example, the impedance calibration circuit illustrated in FIG. 1 or 2. For example, the semiconductor memory apparatus 905 may be configured as illustrated in FIG. 6. Accordingly, the semiconductor memory apparatus 905 may be configured to perform the impedance matching operation in a plurality of operation voltage modes.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A circuit for calibrating impedance, the circuit comprising:
   a first reference resistor electrically coupled to a calibration pad;
   a second reference resistor which is coupled to the first reference resistor in parallel and a resistance value of the second reference resistor is varied according to an operation voltage mode; and
   a calibration circuit electrically coupled to the calibration pad and configured to generate a calibration code according to a resistance value formed by the first reference resistor and the second reference resistor and calibrate an impedance value in the calibration pad according to the calibration code.

2. The circuit of claim 1, wherein the first reference resistor and the second reference resistor are embedded in a semiconductor chip.

3. The circuit of claim 1, wherein the first reference resistor is disposed outside a semiconductor chip, and the second reference resistor is embedded in the semiconductor chip.

4. The circuit of claim 1, wherein a resistance value of the second reference resistor is determined in response to a control signal generated according to the operation voltage mode.

5. The circuit of claim 1, wherein only the first reference resistor operates as a reference resistor in a first operation voltage mode, and the first reference resistor and the second reference resistor operate as the reference resistor in a second operation voltage mode.

6. The circuit of claim 5, wherein the circuit operates at a first voltage level in the first operation voltage mode, and the circuit operates at a second voltage level in the second operation voltage mode.

7. The circuit of claim 1, wherein the calibration circuit further comprises a first pull-up circuit, a second pull-up circuit, and a pull-down circuit,
   and when a calibration operation is completed a reference resistor has a same impedance value as the first pull-up circuit and the second pull-up circuit has a same impedance value as the pull-down circuit.

8. The circuit of claim 1, further comprising a reference voltage generation circuit configured to divide a power voltage to generate a plurality of divided voltages and output one of the divided voltages as a reference voltage.

9. A semiconductor memory apparatus comprising:
   an impedance calibration circuit configured to generate a calibration code according to a resistance value formed by a first reference resistor and a second reference resistor of which a resistance value is varied according to an operation voltage mode and calibrate an impedance value in a calibration pad to which the first and second reference resistors are coupled in response to the calibration code; and
   a data input/output driver configured to calibrate an impedance value of an output signal in response to the calibration code.

10. The semiconductor memory apparatus of claim 9, wherein the first reference resistor and the second reference resistor are embedded in the semiconductor memory apparatus.

11. The semiconductor memory apparatus of claim 9, wherein the first reference resistor is disposed outside the semiconductor memory apparatus, and the second reference resistor is embedded in the semiconductor memory apparatus.

12. The semiconductor memory apparatus of claim 9, wherein a resistance value of the second reference resistor is determined in response to a control signal generated according to the operation voltage mode.

13. The semiconductor memory apparatus of claim 9, wherein the data input/output driver is configured to receive input data and generate output data by driving the input data according to the calibration code.

14. The semiconductor memory apparatus of claim 13, wherein the data input/out driver further comprises:
- a pre pull-up driver configured to generated a pull-up control signal in response to receiving a first code provided by the impedance calibration circuit and the input data,
- a pre pull-down driver configured to generate a pull-down control signal in response to receiving a second code provided by the impedance calibration circuit and the input data, and
- a main pull-up driver and a main pull-down driver configured generate the output signal in response to the pull-up control signal and the pull-down control signal.

15. The semiconductor memory apparatus of claim 14, wherein the impedance value of the output signal is calibrated in response to the pull-up control signal and the pull-down control signal.

16. The semiconductor memory apparatus of claim 14, wherein the main pull-up driver further comprises a plurality of legs driven by a pull-up control signal.

17. The semiconductor memory apparatus of claim 14, wherein the main pull-up driver is comprised of a plurality of legs, where the plurality of legs includes a first group of legs comprised of at least one leg having a first resistance value, a second group of legs comprised of at least one leg having a second resistance value, and a third group of legs comprised of at least one leg having a third resistance value.

18. The semiconductor memory apparatus of claim 14, wherein the main pull-up driver is comprised of a plurality of legs divided into a plurality of groups of legs and the pull-up control signal is comprised of a plurality of bits, wherein each group of legs is controlled by at least one bit of the pull-up control signal, where no bit is used to control more than one group of legs.

19. The semiconductor apparatus of claim 9, wherein the impedance value is determined according to more than one calibration code.

* * * * *